US008585246B2

(12) United States Patent
Petersen et al.

(10) Patent No.: US 8,585,246 B2
(45) Date of Patent: Nov. 19, 2013

(54) OPTOELECTRONIC MODULE AND PROJECTION APPARATUS COMPRISING THE OPTOELECTRONIC MODULE

(75) Inventors: Kirstin Petersen, Regensburg (DE); Stefan Grötsch, Lengfeld-Bad Abbach (DE); Stephan Miller, Pentling (DE); Günter Spath, Regensburg (DE); Norbert Linder, Lappersdorf (DE); Dominik Eisert, Regensburg (DE); Matthias Peter, Alteglofsheim (DE)

(73) Assignee: OSRAM Optosemiconductors GmbH, Regensburg (DE)

( * ) Notice: Subject to any disclaimer, the term of this patent is extended or adjusted under 35 U.S.C. 154(b) by 405 days.

(21) Appl. No.: 12/863,717

(22) PCT Filed: Jan. 26, 2009

(86) PCT No.: PCT/DE2009/000103
§ 371 (c)(1),
(2), (4) Date: Oct. 4, 2010

(87) PCT Pub. No.: WO2009/094994
PCT Pub. Date: Aug. 6, 2009

(65) Prior Publication Data
US 2011/0019411 A1 Jan. 27, 2011

(30) Foreign Application Priority Data

Jan. 31, 2008 (DE) .......................... 10 2008 006 974
Apr. 3, 2008 (DE) .......................... 10 2008 017 071

(51) Int. Cl.
*F21V 9/06* (2006.01)
*F21V 9/16* (2006.01)

(52) U.S. Cl.
USPC ......... 362/293; 362/84; 362/249.02; 362/231

(58) Field of Classification Search
USPC ...................... 362/249.02, 231, 84, 293, 294; 313/112; 257/89, 98
See application file for complete search history.

(56) References Cited

U.S. PATENT DOCUMENTS

| | | | |
|---|---|---|---|
| 5,813,752 A * | 9/1998 | Singer et al. ................... | 362/293 |
| 5,813,753 A * | 9/1998 | Vriens et al. ................... | 362/293 |
| 6,994,453 B2 * | 2/2006 | Blanchard ...................... | 362/293 |
| 7,036,946 B1 * | 5/2006 | Mosier ............................ | 362/27 |
| 7,070,300 B2 * | 7/2006 | Harbers et al. ................ | 362/231 |
| 7,394,188 B2 * | 7/2008 | Ouderkirk et al. ............. | 313/110 |
| 7,543,959 B2 * | 6/2009 | Bierhuizen et al. ........... | 362/293 |

(Continued)

FOREIGN PATENT DOCUMENTS

| | | |
|---|---|---|
| EP | 1 492 387 A1 | 12/2004 |
| EP | 1 768 464 A1 | 3/2007 |

(Continued)

*Primary Examiner* — Peggy A. Neils
(74) *Attorney, Agent, or Firm* — Slater & Matsil, L.L.P.

(57) ABSTRACT

An optoelectronic module for emitting monochromatic radiation in the visible wavelength range is specified. The module has a plurality of light emitting diode chips which generate UV radiation. The UV radiation is converted into light in the visible range, for example, into green light, by a wavelength converter. The coupling-out of light from the module is optimized by the use of two selectively reflecting and transmitting filters. This module can be used as a light source in a projection apparatus.

17 Claims, 7 Drawing Sheets

(56) References Cited

U.S. PATENT DOCUMENTS

| | | | |
|---|---|---|---|
| 7,800,287 B2 * | 9/2010 | Zheng et al. | 313/112 |
| 7,934,862 B2 * | 5/2011 | Anandan | 362/606 |
| 8,118,441 B2 * | 2/2012 | Hessling | 362/84 |
| 2004/0116033 A1 | 6/2004 | Ouderkirk et al. | |
| 2004/0242115 A1 | 12/2004 | Yanagawa | |
| 2005/0259049 A1 | 11/2005 | Chen | |
| 2006/0057753 A1 | 3/2006 | Schardt et al. | |
| 2007/0131954 A1 | 6/2007 | Murayama et al. | |
| 2009/0059588 A1 | 3/2009 | Engl et al. | |
| 2009/0261366 A1 | 10/2009 | Eisert et al. | |

FOREIGN PATENT DOCUMENTS

| | | |
|---|---|---|
| GB | 2 404 276 A | 12/2003 |
| GB | 2 432 249 A | 5/2007 |
| JP | 11-145519 A | 5/1999 |
| JP | 2004-031843 A | 1/2004 |
| JP | 2004-219446 A | 8/2004 |
| JP | 2005-294288 A | 10/2005 |
| JP | 2005-322857 A | 11/2005 |
| JP | 2005-537651 A | 12/2005 |
| WO | WO 03/093394 A1 | 11/2003 |
| WO | WO 2005/051044 A1 | 6/2005 |
| WO | WO 2007/036214 A1 | 4/2007 |

* cited by examiner

OPTOELECTRONIC MODULE AND PROJECTION APPARATUS COMPRISING THE OPTOELECTRONIC MODULE

This patent application is a national phase filing under section 371 of PCT/DE2009/000103, filed Jan. 26, 2009, which claims the priority of German patent application 10 2008 006 974.4, filed Jan. 31, 2008 and 10 2008 017 071.2, filed Apr. 3, 2008, each of which is incorporated herein by reference in its entirety.

BACKGROUND

A light source having a high light power is required for projection apparatuses. Conventional light sources for projection apparatuses are operated at high operating currents and develop considerable waste heat. These disadvantageous effects could be avoided by the use of light emitting diode chips as a light source. Hitherto, however, the light power of light emitting diode chips has been too low for a large number of projection applications.

Optoelectronic components are specified in PCT patent publication WO 2007/036214 A1, U.S. equivalent publication 2009/0261366 and U.S. Patent Application Publication 2006/0057753 A1.

SUMMARY

In one aspect, the present invention specifies an optoelectronic component having a high light power.

The inventors have ascertained that the radiative efficiencies of light emitting diode chips decrease greatly as the wavelength of the generated radiation increases. By way of example, the radiative efficiency of a light emitting diode chip which generates UV radiation is significantly higher than that of a light emitting diode chip which generates radiation in the green wavelength range. These light emitting diode chips are designated hereinafter in shortened fashion as UV LEDs and as green LEDs, respectively.

On one hand, even at low operating currents I, for example, at I=20 mA, the emitted power of a UV LED is higher than that of a green LED. On the other hand, when the operating current is increased, a saturation in the power is achieved more rapidly in the case of a green LED than in the case of a UV LED. In this case, the linearity factor $L_{80/20}$ is a measure of the high-current efficiency of a light emitting diode. $L_{80/20}$ results from the quotient of the emitted light powers P at operating currents of I=80 mA and I=20 mA. In the ideal case, this factor corresponds to the ratio of the two operating currents and has a value of 4. Whereas this ideal value is almost achieved in the case of UV LEDs, it is greatly undershot in the case of green LEDs.

An optoelectronic component comprising a UV LED and a wavelength converter is specified. The generated UV radiation is emitted by a front side of the LED and impinges on the wavelength converter. The latter converts the UV radiation at least partly into visible light.

This arrangement makes it possible to emit monochromatic radiation in the visible range with high efficiency. In this case, radiation is designated as monochromatic if its wavelength lies in a narrowly delimited range. The spectral full width at half maximum $\Delta\lambda$ of the emitted radiation preferably lies in the range of 10 nm to 100 nm.

A light emitting diode chip which emits ultraviolet radiation, that is to say radiation having a wavelength $\lambda \leq 420$ nm, is based on indium gallium nitride (InGaN), for example. This light emitting diode chip can be embodied as a thin-film light emitting diode chip.

Preferably, the wavelength converter converts the UV radiation into green light having a main wavelength $\lambda_{Peak}$ in the range of 490 nm to 545 nm. In this case, the main wavelength is the wavelength at which the intensity maximum of the emitted light lies.

In other embodiments of the wavelength converter, it is also possible to generate blue light in the wavelength range of 420 nm to 490 nm, or red or yellow light in the wavelength range of 575 nm to 750 nm.

The wavelength converter preferably contains a matrix material, in which particles of a wavelength conversion substance are situated. Transparent materials such as glass, quartz, sapphire, silicon carbide, transparent ceramics such as, for example, $Al_2O_3$, diamond, silicone, acrylates, polyimide, polycarbonate, epoxy resins or else mixtures of these materials are suitable as matrix material. Preferably, the matrix material has a high thermal conductivity and, as a result, can dissipate well the waste heat that arises. Materials having a very high thermal conductivity are silicon carbide or diamond, for example.

Particles of a wavelength conversion substance are preferably distributed uniformly to the greatest possible extent in the matrix material.

Suitable wavelength conversion substances include materials doped with metals from the group of the rare earths such as, for example, garnets, alkaline earth metal sulphides, thiogallates, aluminates, orthosilicates, chlorosilicates, alkaline earth metal silicon nitrides, oxynitrides, aluminum oxynitrides and silicon oxynitrides. By way of example, YAG:Ce, the garnet phosphor YAG doped with cerium, is used.

In one embodiment, the matrix material is simultaneously formed by the converter material; by way of example, a YAG ceramic can be used. In other words, the wavelength converter is embodied as a ceramic converter lamina, for example. In this case, the ceramic wavelength conversion substance is sintered to form a ceramic layer, in which it is possible to set the scattering of the radiation passing through by means of the density of the ceramic material and the pore size of air inclusions in the ceramic material.

In addition, the ceramic layer has a higher thermal conductivity than a wavelength converter in which the wavelength conversion substance is introduced into a matrix material such as silicone. Heat can be dissipated by the wavelength converter particularly efficiently in this way.

The ceramic layer can be self-supporting. The ceramic layer then simultaneously forms the wavelength converter and also a carrier for the wavelength converter. However, it is also possible for the ceramic layer to be fixed or deposited on a transparent, thermally conductive carrier such as sapphire or silicon carbide by means of methods such as hot isostatic pressing or pulsed laser deposition.

In one preferred embodiment of the optoelectronic component, at least one filter which has a high transmissivity for one of the two types of radiation and a high reflectivity for the other type of radiation is arranged in the beam path.

The expression "high transmissivity" of an optical element, such as, for example, of a filter, can mean here and hereinafter that at least 50% of the radiation impinging on the element passes through the element. Preferably, at least 75% of the radiation impinging on the element passes through the element, particularly preferably at least 90%.

The expression "high reflectivity" of an optical element, such as, for example, of a filter, can mean here and hereinafter that at least 50% of the radiation impinging on the element is reflected by the element. Preferably, at least 75% of the radiation impinging on the element is reflected by the element, particularly preferably at least 90%.

If the filter is selectively transmissive for the UV radiation and reflects the radiation in the visible wavelength range, it is designated as a UV filter. If it is selectively transmissive for the light in the visible range and reflects the UV radiation, it is designated by the generic term visible filter. If it is provided for the transmission of radiation in a more narrowly delimited wavelength range, it is specified more precisely by the terms green filter, blue filter, yellow filter or red filter, depending on the wavelength range.

In one preferred embodiment, a UV filter which has a high transmissivity for the UV radiation and a high reflectivity for the radiation in the visible wavelength range is situated between the UV LED and the wavelength converter.

If converted light impinges from the wavelength converter on the UV filter, then it is reflected back in the direction of the wavelength converter and, in particular, in the direction of a coupling-out structure of the optoelectronic component. This results in an increased coupling-out efficiency of the component. Without a UV filter, the visible light could be absorbed in the UV LED, a carrier or a housing.

In a further embodiment, a visible filter having a high transmissivity for the radiation in the visible wavelength range and a high reflectivity for the UV radiation is situated between the wavelength converter and a coupling-out structure of the UV LED.

Firstly, the wavelength of the emitted light and also the full width at half maximum thereof can be set by means of the visible filter. By way of example, the visible filter is only transmissive for green light in the wavelength range of between 490 nm and 545 nm. Preferably, the visible filter therefore also prevents UV radiation harmful to the human eye from penetrating toward the outside. Secondly, by virtue of the reflection of radiation which does not lie in the desired wavelength range to be emitted, the conversion efficiency of the component and thus the emitted power are increased. In particular, unconverted UV radiation is reflected back into the wavelength converter and can be converted into visible light there.

In one particularly advantageous embodiment, the optoelectronic component has both a UV filter and a visible filter.

By way of example, one or both of the filters is or are embodied as a Bragg mirror. A Bragg mirror is composed of dielectric layers having alternately high and low refractive indices. By way of example, a dielectric layer can contain titanium dioxide ($TiO_2$), silicon dioxide ($SiO_2$), aluminum oxide ($Al_2O_3$), silicon nitride (SiN), tantalum pentoxide ($Ta_2O_5$) or hafnium oxide ($HfO_2$).

In one embodiment, one or both of the filters is or are arranged on carriers.

In order to enable the optimum functioning of the filter, the surface of the carrier should be as planar as possible.

Preferably, the carrier has a high thermal conductivity and thus enables the heat generated in the UV LED and in the converter to be dissipated. By way of example, the carrier contains silicon carbide having a productivity of approximately 200 W/mK. A carrier of this type is particularly advantageous for the UV filter since the latter is situated in the vicinity of the UV LED. The carrier can likewise contain one or a plurality of the materials which are suitable as matrix material for the wavelength converter.

In one preferred embodiment, one or both of the carriers is or are monolithically integrated into the wavelength converter. In other words, carrier and wavelength converter are mechanically fixedly connected to one another. This connection cannot be released in a non-destructive fashion. Carrier and wavelength converters are then formed in one piece. In particular, the wavelength converter can simultaneously constitute the carrier for the filters. This enables a particularly space-saving arrangement of the filters and of the wavelength converter. Moreover, in the case where the wavelength converter is simultaneously utilized as a carrier for the filters, the production of the arrangement is particularly cost-effective.

Preferably, the UV filter is fixedly connected to the UV LED.

In one embodiment, the UV filter is fixed to a radiation-emitting front side of the UV LED by means of a connecting material. Suitable connecting materials are transparent materials such as silicone adhesive or a potting material.

In another embodiment, the UV filter is monolithically integrated into a radiation-emitting front side of the UV LED. For this purpose, the UV filter can be produced by means of methods which are also used for producing the semiconductor body or are readily compatible with the methods. Such methods are sputtering or epitaxial growth, for example. The production process for the filter is thus technically simplified.

Furthermore, an optoelectronic module composed of the components mentioned above is specified which contains at least two UV LEDs. At least one wavelength converter is situated in the beam path of the UV radiation generated. In one preferred embodiment of the optoelectronic component, at least one filter having a high transmissivity for one of the two types of radiation and a high reflectivity for the other type of radiation is arranged in the beam path.

Preferably, the UV LEDs are arranged in one plane and have the same main emission direction. By way of example, the UV LEDs are arranged as a regular lattice. The wavelength converter is preferably embodied as a planar layer which is disposed downstream of the UV LEDs in the main emission direction and covers them.

Preferably, one or a plurality of UV filters is or are arranged between the UV LEDs and the wavelength converter and at least one visible filter is arranged between the wavelength converter and a coupling-out area of the optoelectronic module.

The brightness of the light source is increased by the combination of a plurality of UV LEDs. In this case, the production of the module and the incorporation thereof into a housing, for example, into a projector housing, can be realized in a technically simple and cost-effective manner.

In one preferred embodiment, all of the UV LEDs radiate into a common wavelength converter and a common UV filter. The converted light preferably passes through a common visible filter. In this case, these components can directly adjoin one another and be fixedly connected to one another, for example. In particular, the filters can be monolithically integrated into the wavelength converter. The common UV filter can be fixed to the UV LEDs by means of a connecting material, for example, a silicone adhesive or a potting material.

In one preferred embodiment, a common UV filter and a common visible filter are in each case embodied as planar layers. In this case, the UV filter is disposed downstream of the UV LEDs in the main emission direction and covers them as completely as possible. The visible filter is disposed downstream of the wavelength converter in the main emission direction of the UV LEDs and likewise covers it as completely as possible.

Such common components can be produced technically more simply and more cost-effectively than separate components. Moreover, a large common component has a higher mechanical stability. It can be fitted to a housing in a technically simpler and more cost-effective manner.

In one preferred embodiment, a common visible filter is spaced apart from the wavelength converter. An air gap or a potting material can be situated in the interspace. The heat which arises in the UV LEDs can be better dissipated by means of such an interspace.

In another embodiment, the UV LEDs have in each case separate UV filters, separate wavelength converters and separate visible filters. This arrangement has the advantage that the light emitting diode chips can be mounted more flexibly, for example, even onto curved surfaces. Preferably, interspaces filled with air or a potting material are situated between the components, the interspaces enabling good heat dissipation.

Further embodiments of the optoelectronic module have a combination of components which are common to a plurality of UV LEDs, and of components which are present separately for some UV LEDs. By way of example, a plurality of UV LEDs can share a UV filter and other UV LEDs can have separate UV filters.

By way of example, in one embodiment, the UV filters and wavelength converters can be embodied separately and the visible filter can be embodied as a common filter. In this case, the UV filters can be monolithically integrated into the UV LEDs. Moreover, on their side remote from the UV LED, they can directly adjoin the wavelength converter and, in particular, be monolithically integrated into the latter. In another embodiment, they are spaced apart from the wavelength converter. The visible filter can likewise adjoin a wavelength converter, in particular be monolithically integrated into the latter or else be spaced apart from the latter. The interspaces present can be filled with air or a potting material.

The described optoelectronic module in its various embodiments can be used, for example, as a light source in a projection apparatus. Such an optoelectronic module can have a large light emission area through the use of a sufficiently large number of UV LEDs. The module, in the same way also as the optoelectronic component having a single UV LED, generates a high luminous flux with good high-current efficiency. For optimum heat dissipation, interspaces filled with air or a potting material can be introduced into the module. Moreover, the module can be integrated into the frame, whereby the heat dissipation can likewise be improved.

In accordance with at least one embodiment of the optoelectronic module, the module emits monochromatic green radiation in the wavelength range of 490 nm to 575 nm.

In accordance with at least one embodiment of the optoelectronic module, the module emits monochromatic blue radiation in the wavelength range of 420 nm to 490 nm.

In accordance with at least one embodiment of the optoelectronic module, the module emits monochromatic yellow or red radiation in the wavelength range of 575 nm to 750 nm.

In accordance with at least one embodiment of the optoelectronic module, at least one light emitting diode chip has a separate wavelength converter.

In accordance with at least one embodiment of the optoelectronic module, at least two, in particular all, light emitting diode chips have a common UV filter.

In accordance with at least one embodiment of the optoelectronic module, at least one light emitting diode chip has a separate UV filter.

In accordance with at least one embodiment of the optoelectronic module, at least two, in particular all, light emitting diode chips have a common visible filter.

In accordance with at least one embodiment of the optoelectronic module, at least one light emitting diode chip has a separate visible filter.

BRIEF DESCRIPTION OF THE DRAWINGS

The semiconductor chip specified and its advantageous configurations are explained below with reference to schematic figures that are not true to scale. In the figures.

DETAILED DESCRIPTION OF ILLUSTRATIVE EMBODIMENTS

Figure 1:
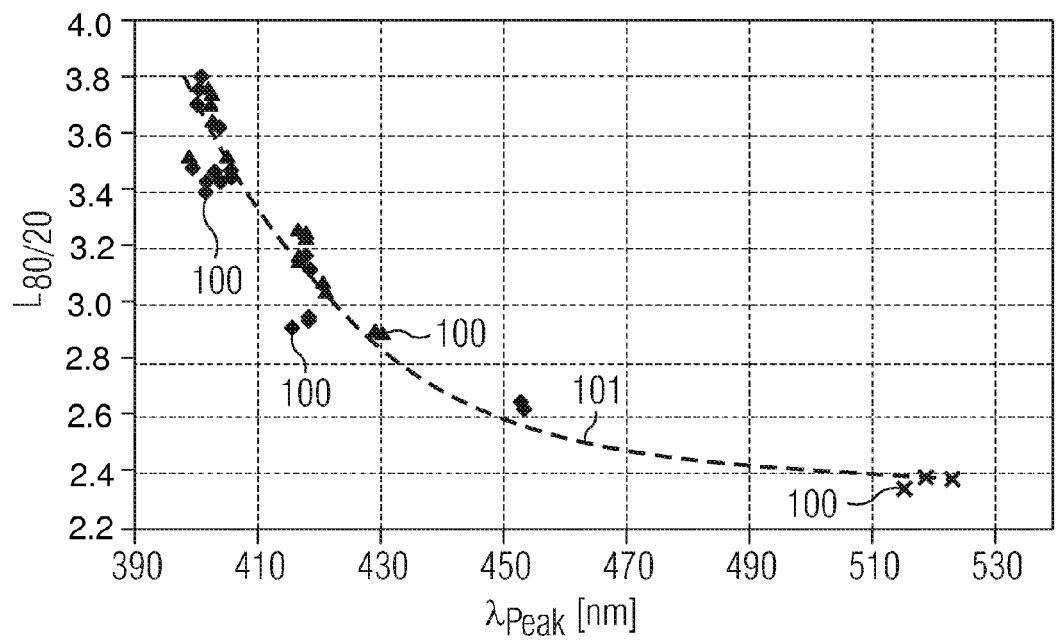
FIG. 1 shows the linearity factors $L_{80/20}$ of various LEDs as a function of the main wavelength $\lambda_{Peak}$ of the emitted light.

In the figures depicted, the wavelength converters 2, the UV filters 3 and the visible filters 4 are present in different embodiments. The letter a is in each case added to the reference symbols if a plurality of light emitting diode chips 1 share a common wavelength converter 2a or a common filter 3a, 4a. If a light emitting diode chip 1 has a separate wavelength converter 2b or separate filters 3b, 4b, then the letter b is added.

In the exemplary embodiments described in the following figures, green InGaN LEDs and UV InGaN LEDs are present in a standard design. In addition, a green filter is used. However, this is not in any way intended to constitute a restriction to InGaN LEDs and the generation of green light. Rather, LEDs having other semiconductor layer sequences and other designs can be used in an analogous manner. In addition, the emitted radiation can have a different wavelength, for example radiation in the blue, red or yellow wavelength range.

In FIG. 1A, for various InGaN LEDs of standard design, the linearity factor $L_{80/20}$ is in each case plotted against the main wavelength $\lambda_{Peak}$ of the emitted light. A fitted curve 101 was drawn through the resulting measurement values 100 for the individual LEDs.

The linearity factor $L_{80/20}$ is a measure of the high-current efficiency of the LED and is defined as the ratio of the emitted powers at operating currents of I=80 mA and I=20 mA. Ideally, this factor corresponds to the ratio of the two operating currents and should therefore be close to a value of 4.

The LEDs measured here generate light having main wavelengths $\lambda_{Peak}$ in the range of 400 nm to 525 nm. It can be seen in FIG. 1 that the high-current efficiency decreases distinctly in the direction of higher wavelengths. By way of example, at a wavelength in the region of 400 nm, that is to say for violet radiation, $L_{80/20}$ is in the range of 3.4 to 3.8. At a wavelength of 420 nm, that is to say for blue radiation, $L_{80/20}$ has fallen to a value in the range of 2.9 to 3.3. At wavelengths in the region of 520 nm, that is to say for green radiation, $L_{80/20}$ lies below a value of 2.4.

Figure 2:
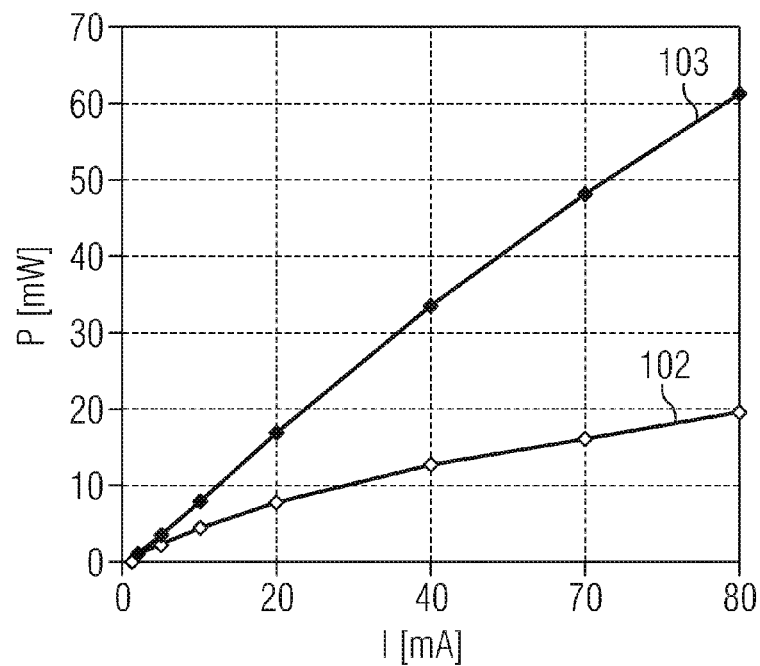
FIG. 2 shows the emitted light powers P as functions of the operating currents I for a UV LED and a green LED.

In FIG. 2, for a green InGaN LED 102 with $\lambda_{Peak}$=525 nm and for a UV InGaN LED 103 with $\lambda_{Peak}$=400 nm, the emitted light powers P in mW are plotted against the operating currents I for 0 mA≤I≤80 mA.

Firstly, the better internal efficiency of the UV LED 103 is evident from FIG. 2. In the entire range of the operating current, the light power of the UV LED 103 lies above the light power of the green LED 102. By way of example, at an operating current of I=80 mA, the light power of the UV LED 103 is three times as high as the light power of the green LED 102. Moreover, FIG. 2 shows the distinctly better high-current efficiency of the UV LED 103. While in the case of the green LED 102 the light power slightly more than doubles from I=20 mA to I=80 mA, the light power of the UV LED 103 triples.

Figure 3A:
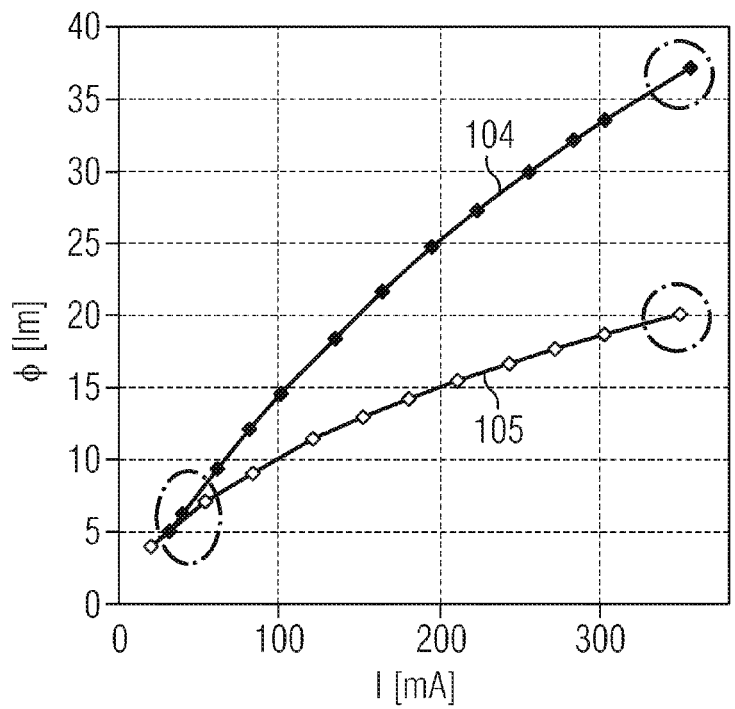
FIG. 3A shows the luminous fluxes $\phi$ as functions of the operating currents I for a UV LED with wavelength converter and for a green LED.

In FIG. 3A, for a UV LED with wavelength converter 104, referred to hereinafter as converter LED, and for a green LED 105, the luminous fluxes φ in lumens are plotted against the operating currents I in mA. The luminous flux φ is a measure of the brightness of a light source weighted with visual sensitivity. In order to calculate φ, the output power of the LED in a specific spectral range is multiplied by the visual sensitivity in this spectral range and then the integral over the entire spectral space is formed.

The converter LED 104 emits light having a main wavelength $\lambda_{Peak}$=527 nm. In the entire measured current range of 20 mA≤I≤350 mA, the luminous flux φ generated by the converter LED 104 is greater than that of the green LED 105. While the luminous fluxes φ of the two LEDs are at similar values at an operating current of I=50 mA, the distance between the curves 104, 105 is significantly greater at an operating current of I=350 mA. These regions have been encircled in FIG. 3A for clarification purposes. At an operating current of I=350 mA, the converter LED 104 has a luminous flux φ that is 85% greater than the luminous flux φ of the green LED 105. Moreover, the linearity factor $L_{80/20}$ for the converter LED 104 with $L_{80/20}$=3.35 is significantly more favorable than for the green LED 105 with $L_{8020}$=2.25.

Figure 3B:
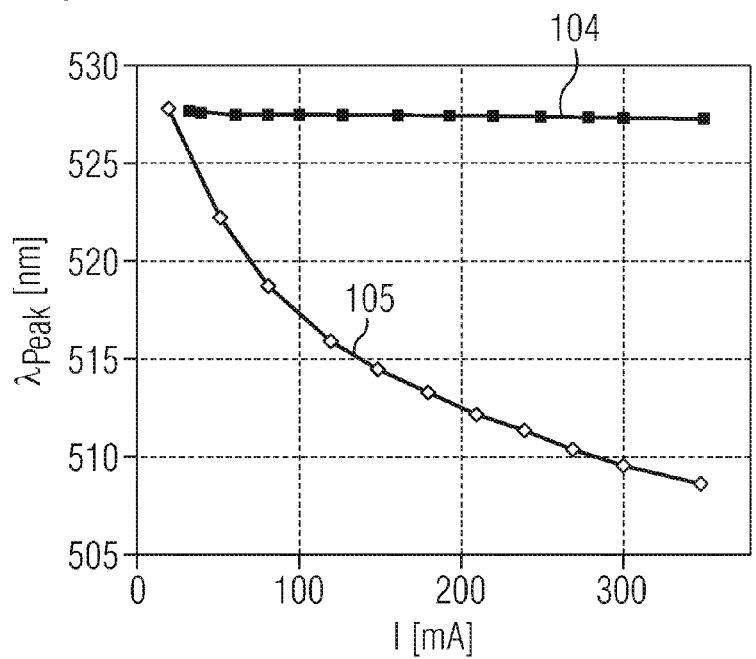
FIG. 3B shows the main wavelengths $\lambda_{Peak}$ as functions of the operating currents I for a UV LED with wavelength converter and a green LED.

In FIG. 3B, for the LEDs 104, 105 in accordance with FIG. 3A, the main wavelengths $\lambda_{Peak}$ are plotted against the operating currents I in mA.

For both LEDs 104, 105, the emitted light at I=20 mA has a main wavelength of $\lambda_{Peak}$≈528 nm. In the case of the green LED 105, the main wavelength is shifted in the direction of shorter wavelengths in the event of an increase in the operating current. In the case of the converter LED 104, however, the main wavelength decreases only to a small extent between 20 mA and 350 mA. At I=350 mA, the main wavelength is $\lambda_{Peak}$≈526 nm.

FIGS. 3A and 3B have thus shown that the converter LED 104 has more favorable properties both with regard to the high-current efficiency and with regard to the wavelength shift in comparison with the green LED 105.

Figure 4A:
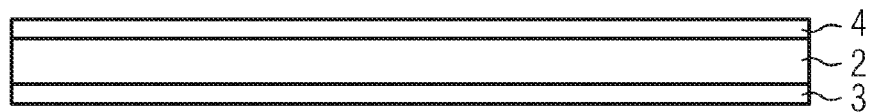
FIG. 4A shows, in cross section, an arrangement of a UV filter, a wavelength converter and a green filter.

FIG. 4A shows one arrangement possibility for a wavelength converter 2, a UV filter 3 and a green filter 4. The wavelength converter 2 is situated between the two filters 3, 4. If this arrangement is used in a converter LED, a UV LED is situated at that side of the UV filter 3 which is remote from the wavelength converter 2.

Figure 4B:
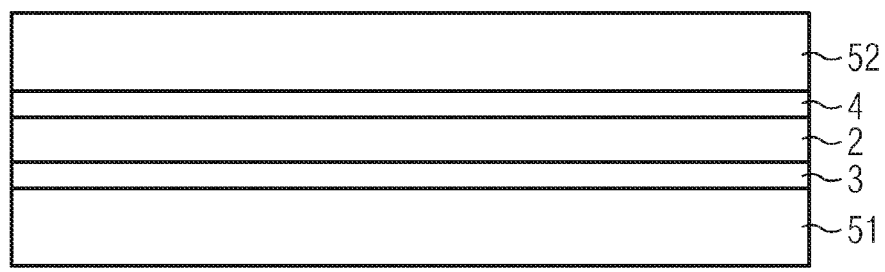
FIG. 4B shows, in cross section, an arrangement of a UV filter with carrier, a wavelength converter and a green filter with carrier.

FIG. 4B illustrates an arrangement which corresponds to the arrangement of wavelength converter 2, UV filter 3 and green filter 4 as shown in FIG. 4A. In this case, however, both filters 3, 4 are arranged on carriers 51, 52. As an alternative to this, it is also possible for only one of the filters 3, 4 to be arranged on a carrier 51, 52. In a departure from the arrangement shown here, the filters 3, 4 can also be arranged on those sides of the carriers 51, 52 which are remote from the wavelength converter 2. Preferably, the carrier material has a high thermal conductivity and, as a result, can dissipate well the heat that arises. In particular, it is advantageous to arrange at least the UV filter 3 on a carrier 51 in order to dissipate the heat that arises in the UV LED.

Figure 5:
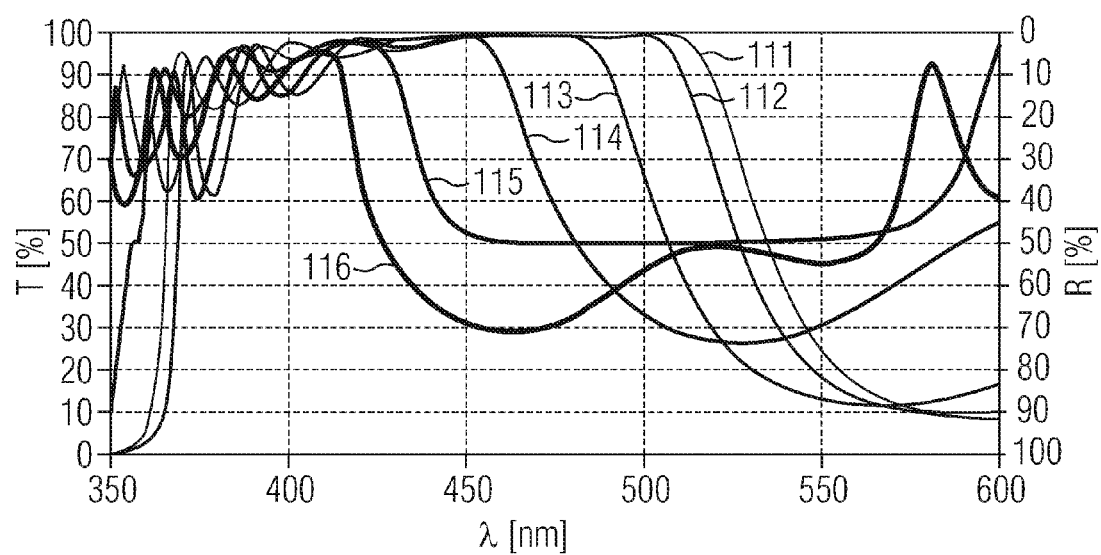
FIG. 5 shows, in the line diagram, the transmissivity and the reflectivity of a UV filter for light having different wavelengths $\lambda$ at different angles $\alpha$ of incidence.

In FIG. 5, the transmissivity T and the reflectivity R of a UV filter are plotted as functions of the wavelength λ of the radiation impinging thereon. Since the values are greatly dependent on the angle of incidence at which the radiation impinges on the UV filter, T and R are illustrated for six different angles of incidence in six curves. In this case, the curves 111, 112, 113, 114, 115 and 116 correspond to the angles of incidence 0°, 15°, 30°, 45°, 60° and 70°. In a range of 380 nm≤λ≤420 nm, the transmissivity is T≈90% for all angles of incidence. For all other wavelength ranges, the transmissivity for a plurality of angles of incidence is distinctly below this value.

The reflectivity R results from the transmissivity T for a present absorption A of the filter as R=100%−T−A. Since the absorption of the filter measured here is negligible, the reflection R results directly from R=100%−T and is likewise evident from FIG. 5. For wavelengths in the range of between 525 nm and 570 nm, at least 45% of the impinging light is reflected for almost all angles of incidence.

The present filter therefore has a high reflectivity selectively for green light, for example, for λ=525 nm, and a high transmissivity selectively for UV radiation, for example, for λ=400 nm, and is therefore referred to as a UV filter.

FIGS. 6A, 6B, 7A, 7B, 8A, 8B, 9A and 9B schematically illustrate various exemplary embodiments of an optoelectronic module. All of the components shown have six UV LEDs 1. One or a plurality of wavelength converters 2a, 2b convert the UV radiation into radiation having a higher wavelength, in this case into green light.

At least one UV filter 3a, 3b which is transmissive to the UV radiation and reflects green radiation is situated between each light emitting diode chip 1 and each wavelength converter 2a, 2b. In one preferred embodiment, the filter has a transmissivity and reflectivity in accordance with FIG. 5. If visible light having a different wavelength is intended to be emitted, a filter having a different reflection behavior can be used. At least one green filter 4a, 4b which is transmissive to the green light and reflects the UV radiation is situated at the side of the wavelength converter 2a, 2b which is remote from the light emitting diode chips 1. In further embodiments, an optoelectronic module can comprise only one type of filters.

Figure 6A:
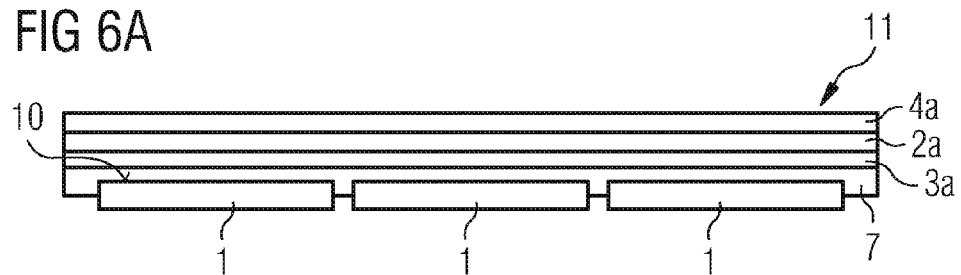
FIG. 6A shows, in cross section, an optoelectronic module comprising a common converter, a common UV filter and a common green filter.

FIG. 6A shows, in cross section, an optoelectronic module 11 wherein all the UV LEDs 1 share a common UV filter 3a, a common green filter 4a, but also a common wavelength converter 2a. In this case, the components 3a, 4a, and 2a are embodied as planar layers directly adjoining one another. The UV filter 3a is fixed to radiation-emitting front sides 10 of the UV LEDs 1 by means of a connecting material 7, which can be a silicone adhesive or a potting material, for example.

Figure 6B:
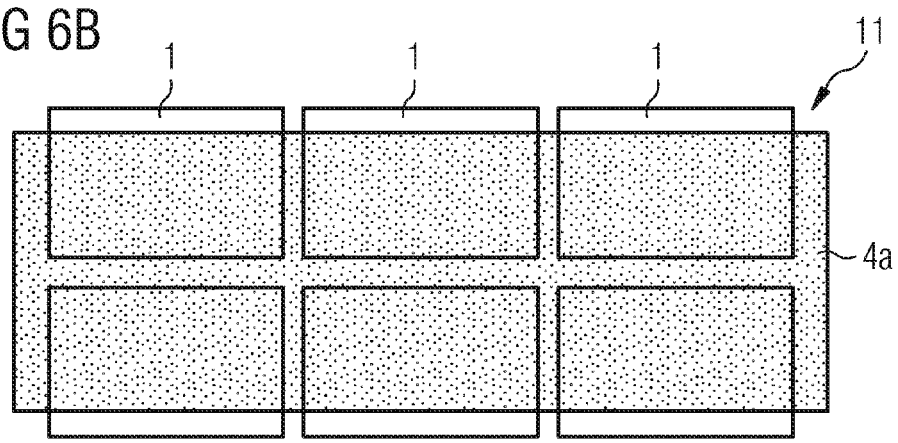
FIG. 6B shows a plan view of the optoelectronic module in accordance with FIG. 6A.

FIG. 6B shows a plan view of this module 11. The six UV LEDs 1 and also the common green filter 4a, which almost completely covers the UV LEDs 1, can be discerned here.

Figure 7A:
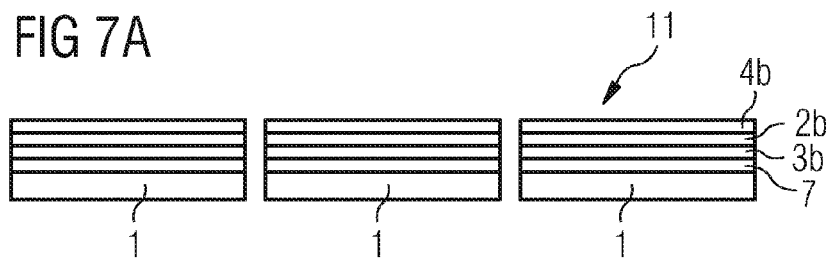
FIG. 7A shows, in cross section, an optoelectronic module comprising separate wavelength converters, separate UV filters and separate green filters.

FIG. 7A reveals, in cross section, an exemplary embodiment of a module 11 wherein each UV LED 1 has a separate UV filter 3b, a separate green filter 4b and also a separate wavelength converter 2b. These elements, analogously to FIG. 6A, are embodied as planar layers and directly adjoin one another. In this case too, the separate UV filters 3b are fixed to the UV LEDs 1 by means of a connecting material 7.

Figure 7B:
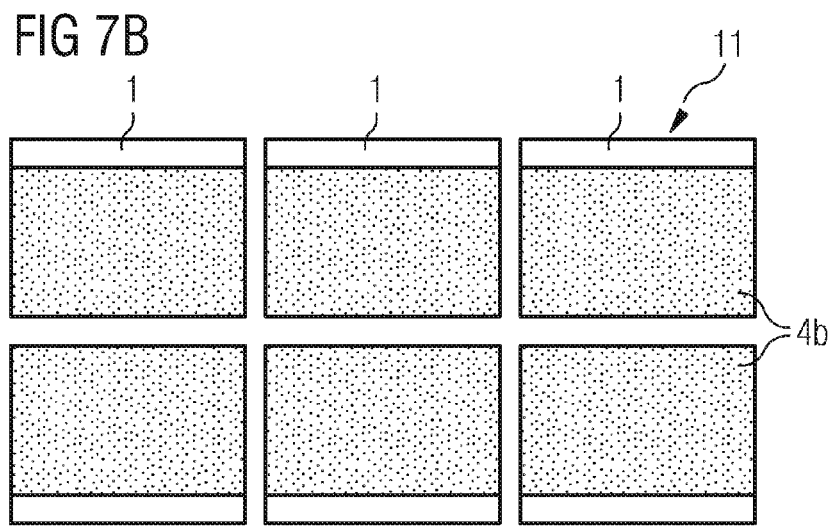
FIG. 7B shows a plan view of the optoelectronic module in accordance with FIG. 7A.

FIG. 7B shows the plan view of the module 11 in accordance with FIG. 7A, wherein the separate green filters 4b can be seen, which cover the UV LEDs 1 apart from the contact regions.

Figure 8A:
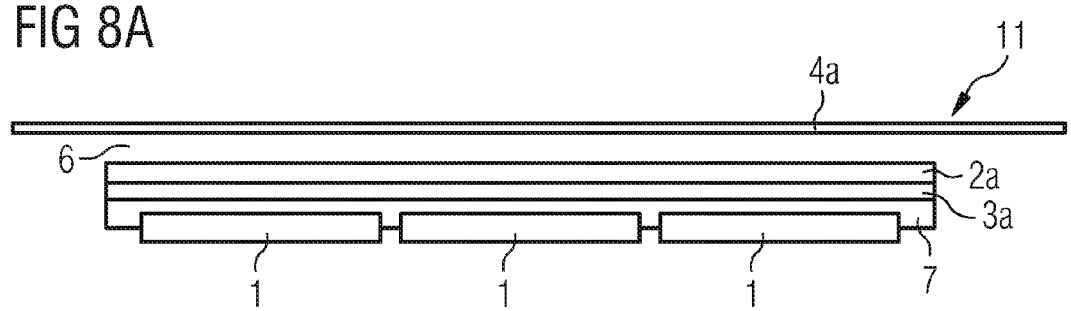
FIG. 8A shows, in cross section, an optoelectronic module comprising a common wavelength converter, a UV filter and a common green filter spaced apart from the converter.

FIG. 8A shows an exemplary embodiment of a module 11 wherein all the UV LEDs 1 share a common wavelength converter 2a, a common UV filter 3a and a common green filter 4a. The UV filter 3a is fixed to the UV LEDs 1 by means of a connecting material 7. The green filter 4a is spaced apart from the wavelength converter 2a. The interspace 6 present is, by way of example, an air gap or is filled with a potting material.

Figure 8B:
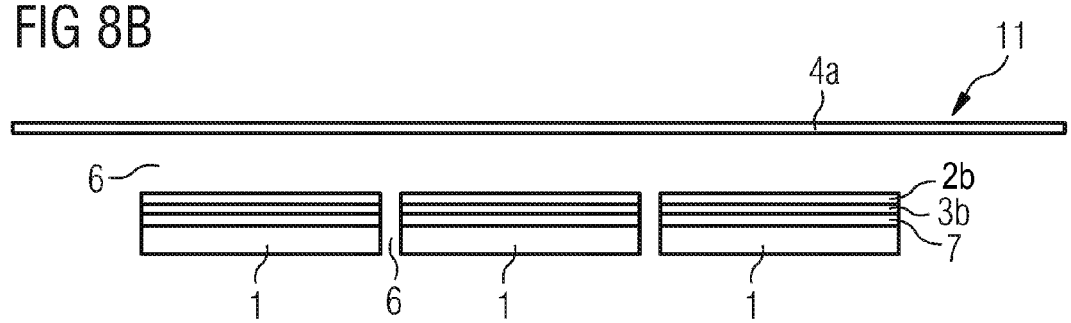
FIG. 8B shows, in cross section, an optoelectronic module comprising separate wavelength converters, separate UV filters and a common green filter spaced apart from the converter.

FIG. 8B shows a further exemplary embodiment of a module 11 wherein, as in FIG. 8A, all the UV LEDs 1 share a common green filter 4a spaced apart from the wavelength converters 2b. In contrast to FIG. 8A, however, here the UV LEDs 1 have separate UV filters 3b and separate wavelength converters 2b.

Figure 9A:
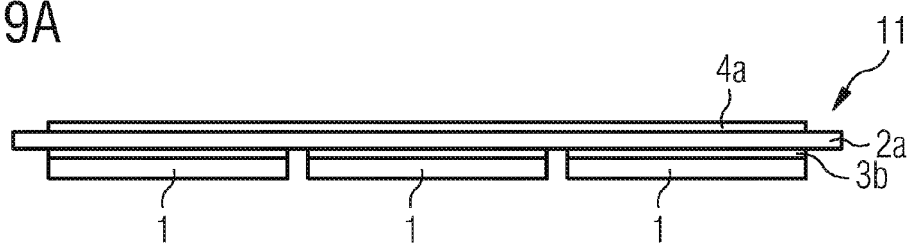
FIG. 9A shows, in cross section, an optoelectronic module comprising a common wavelength converter, separate UV filters monolithically integrated into the UV LEDs, and a common green filter.

FIG. 9A shows an exemplary embodiment of a module 11 comprising a common wavelength converter 2a, a common green filter 4a and separate UV filters 3b. The separate UV filters 3b and the common green filter 4a in each case directly adjoin the wavelength converter 2a. In contrast to all the exemplary embodiments shown previously, the separate UV filters 3b are monolithically integrated into the UV LEDs 1.

Figure 9B:
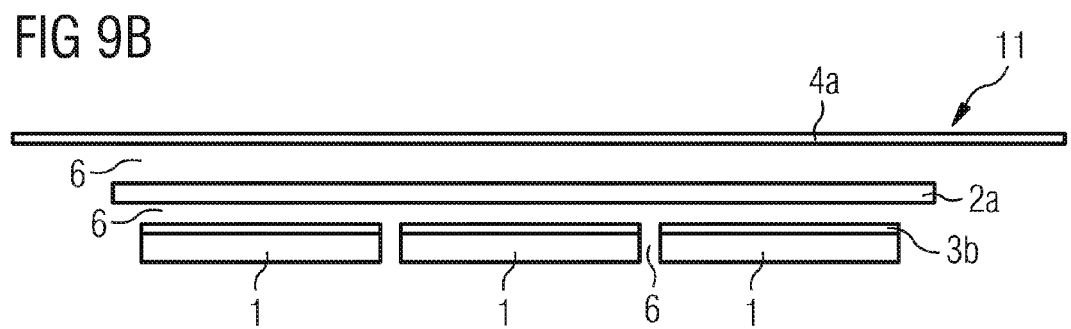
FIG. 9B shows, in cross section, an optoelectronic module in accordance with FIG. 9A, wherein the filters are in each case spaced apart from the wavelength converter in the emission direction.

FIG. 9B illustrates a further exemplary embodiment of a module 11, which differs from the arrangement shown in FIG. 9A by virtue of the additional interspaces 6 between the UV filters 3b and the wavelength converter 2a and also between the green filter 4a and the wavelength converter 2a. The interspaces 6 can contain air or a potting material.

Figure 10A:
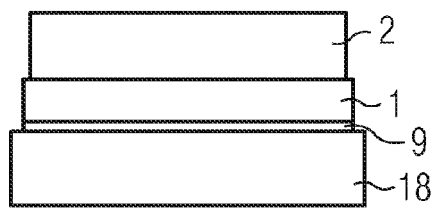
FIG. 10A shows, in cross section, an optoelectronic component without a filter.
Figure 10B:
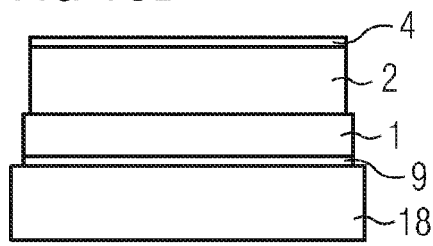
FIG. 10B shows, in cross section, an optoelectronic component with a UV filter.
Figure 10C:
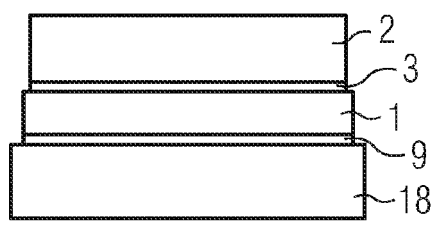
FIG. 10C shows, in cross section, an optoelectronic component with a green filter.
Figure 10D:
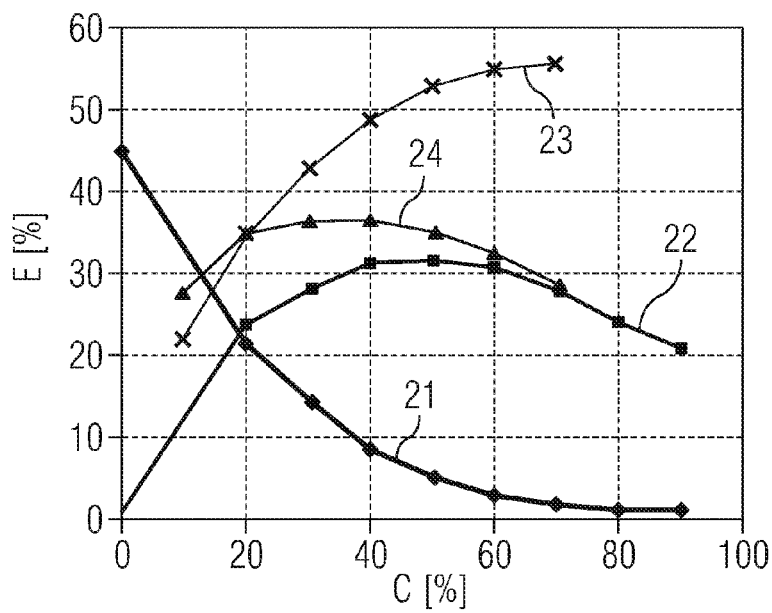
FIG. 10D shows, in the line diagram, the radiative efficiencies E of the components in accordance with FIGS. 10A, 10B and 10C as functions of the phosphor concentrations C.

FIGS. 10A, 10B and 10C illustrate, in cross section, different optoelectronic components, the radiative efficiencies E of which were calculated and are plotted in FIG. 10D.

In FIG. 10A, a UV LED 1 with a wavelength converter 2 is applied on an auxiliary carrier 18, for example, by means of a solder connection 9. The optoelectronic component shown has no filter. In FIG. 10B, a green filter 4 is additionally situated at that side of the wavelength converter 2 which is remote from the UV LED 1. In FIG. 10C, a UV filter 3 is instead situated between the wavelength converter 2 and the UV LED 1.

The radiative efficiencies E of these arrangements were calculated as a function of the phosphor concentration C in the respective wavelength converter 2.

In FIG. 10D, the calculated radiative efficiencies for green light 22, 23, 24 in % of a maximum radiative efficiency are plotted against the phosphor concentration C in % of a maximum concentration. The radiative efficiency for unconverted UV radiation 21 is additionally plotted for the arrangement in accordance with FIG. 10A.

In the case of the arrangement shown in FIG. 10A, with a vanishing phosphor concentration C, as expected no green light is emitted and the radiative efficiency 22 is 0%. By contrast, approximately 45% of the UV radiation 21 generated in the UV LED 1 is coupled out. The radiative efficiency E for the UV radiation 21 decreases as the phosphor concentration rises, and is close to 0% at C=90%. In contrast to this, E for green light 22 firstly rises as the phosphor concentration increases, reaches its maximum value of E≈31% at C=50% and decreases slowly as C continues to rise. The decrease in the radiative efficiency 22 can be attributed to absorption in the wavelength converter and in the LED chip. At C=90%, the radiative efficiency 22 is E=20%.

The radiative efficiency for green light 24 increases as a result of the use of a green filter 4 in accordance with FIG. 10B. This is based on the fact that the green filter reflects a portion of the UV radiation back into the wavelength converter 2 again. Here it can once again be converted into green light.

FIG. 10D also shows the radiative efficiency for green light 23 given the presence of a UV filter 3 in accordance with FIG. 10C. The radiative efficiency 23 is significantly higher than the radiative efficiency 24 when a green filter is present. In the considered range of 10%≤C≤70%, the radiative efficiency 23 rises continuously as the concentration C increases, and has a value of E=55% for C=70%. This can be attributed to the fact that the green light is reflected back by the UV filter and the absorption in the UV LED is thus reduced.

Overall, FIG. 10D clearly reveals that the radiative efficiencies 24, 23 for green light are distinctly increased both by the use of a green filter 4 and by the use of a UV filter 3. While the radiative efficiency 22 has a maximum value in the region of E=30% for the arrangement without a filter, a maximum value of E=35% is achieved in the case of a green filter 4 and a maximum value of distinctly above 50% is achieved in the case of a UV filter 3. It can be expected that the radiative efficiency will be increased again in the event of green filter 4 and UV filter 3 being used simultaneously.

Figure 11:
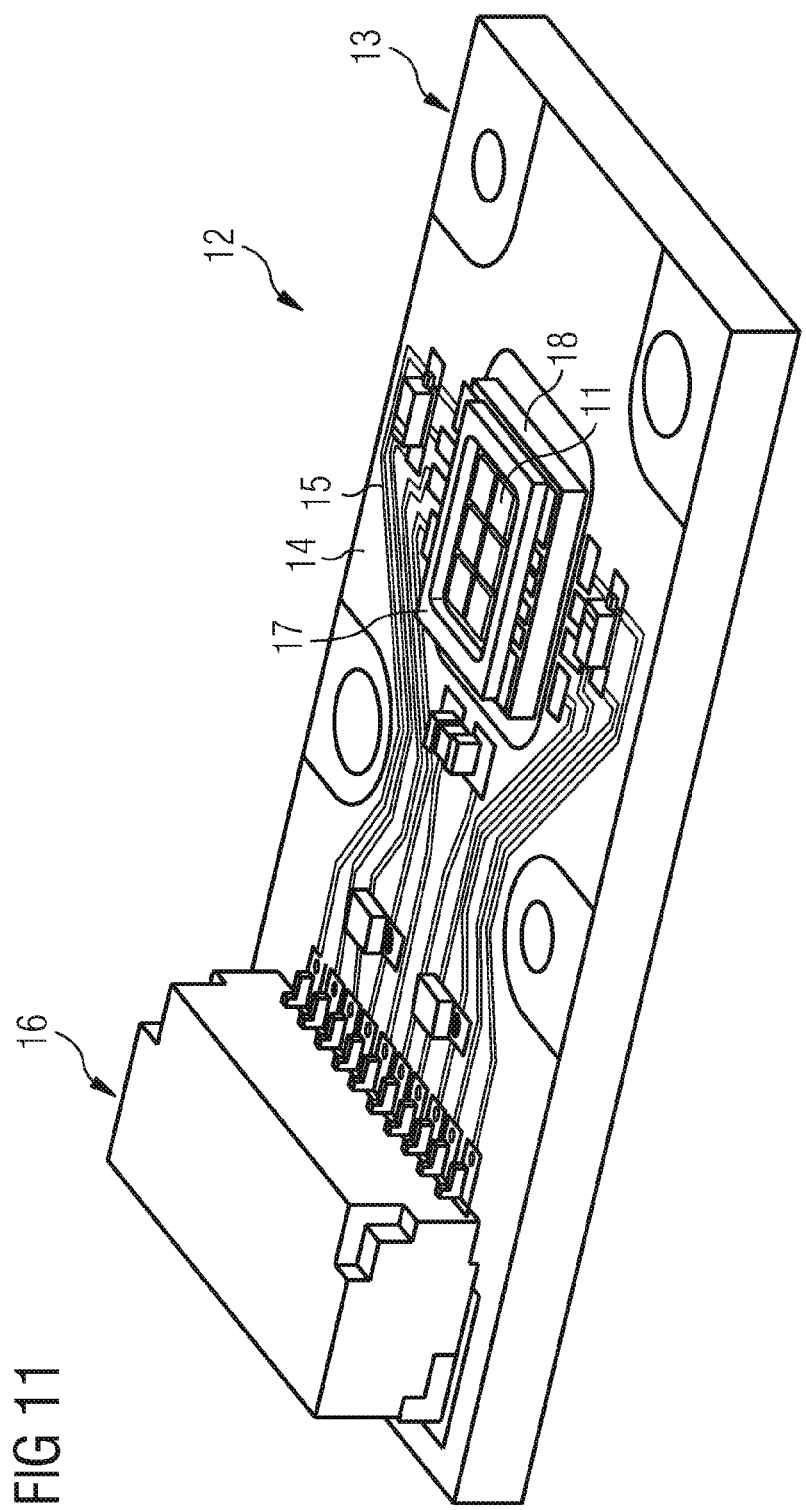
FIG. 11 shows an oblique plan view of a projection apparatus comprising an optoelectronic module as light source.

FIG. 11 shows a projection apparatus 12 wherein an optoelectronic module 11 is used for generating light. The optoelectronic module 11 has six UV LEDs 1, and also the components UV filter 3, wavelength converter 2 and green filter 4 in one of the embodiments in accordance with FIG. 6A, 6B, 7A, 7B, 8A, 8B, 9A or 9B. The optoelectronic module 11 is surrounded by a frame 17, which can dissipate well the heat that arises. The frame is arranged on an auxiliary carrier 18, which is in turn situated on a carrier 13. A printed circuit board 14 is applied on the carrier 13, conductor tracks 15 for making electrical contact with the optoelectronic module 11 being introduced into the printed circuit board. The conductor tracks 15 are connected to a plug 16 that can be electrically connected.

The invention is not restricted to the exemplary embodiments by the description on the basis of the exemplary embodiments, but rather encompasses any novel feature and also any combination of features. This includes, in particular any combination of features in the patent claims, even if this feature or this combination itself is not explicitly specified in the patent claims or exemplary embodiments.

The invention claimed is:

1. An optoelectronic module comprising:
   a plurality of light emitting diode chips that generate UV radiation;
   a wavelength converter disposed downstream of the light emitting diode chips in an emission direction, wherein the wavelength converter converts the UV radiation at least partly into radiation in a visible wavelength range;
   at least one common visible filter for the plurality of light emitting diode chips, the common visible filter being disposed downstream of the wavelength converter in the emission direction and having a high transmissivity for the radiation in the visible wavelength range and a high reflectivity for the UV radiation; and
   at least one UV filter having a high transmissivity for the UV radiation and a high reflectivity for the radiation in the visible wavelength range, wherein the at least one UV filter is monolithically integrated into one light emitting diode chip or is fixed to at least one radiation-emitting side of the light emitting diode chip.

2. The optoelectronic module as claimed in claim 1, wherein the at least one UV filter is situated between the wavelength converter and a light emitting diode chip.

3. The optoelectronic module as claimed in claim 1, wherein the at least one common visible filter is arranged on a radiation-transmissive carrier having a high thermal conductivity.

4. The optoelectronic module as claimed in claim 3, wherein the wavelength converter is contained in the radiation-transmissive carrier.

5. The optoelectronic module as claimed in claim 1, wherein at least two light emitting diode chips operate with the wavelength converter.

6. The optoelectronic module as claimed in claim 1, wherein a filter is spaced apart from the wavelength converter in the emission direction.

7. The optoelectronic module as claimed in claim 6, further comprising air or a potting compound situated between the filter and the wavelength converter.

8. The optoelectronic module as claimed in claim 1, wherein the at least one UV filter is monolithically integrated into a light emitting diode chip.

9. An optoelectronic module comprising:
   at least three light emitting diode chips;
   at least three UV filters, each UV filter transmitting UV radiation and being assigned one-to-one and disposed directly downstream of an associated light emitting diode chip, wherein each light emitting diode chip is monolithically integrated with its associated UV filter;
   exactly one wavelength converter disposed downstream of the light emitting diode chips and UV filters; and
   exactly one visible filter disposed downstream of the wavelength converter.

10. A projection arrangement comprising a light source, the light source comprising an optoelectronic module as claimed in claim 1.

11. The projection arrangement as claimed in claim 10, further comprising a heat-conducting frame, wherein the optoelectronic module is surrounded by the heat-conducting frame.

12. The optoelectronic module as claimed in claim 5, wherein all light emitting diode chips operate with the wavelength converter.

13. The optoelectronic module as claimed in claim 1, wherein the wavelength converter comprises one of a plurality of wavelength converters disposed downstream of the light emitting diode chips.

14. The optoelectronic module as claimed in claim 1, wherein the visible filter transmits at least 75% of the visible radiation impinging on the visible filter and reflects at least 75% of the UV radiation impinging on the visible filter, and wherein the UV filter transmits at least 75% of the UV radiation impinging on the UV filter and reflects at least 75% of the visible radiation impinging on the UV filter.

15. The optoelectronic module as claimed in claim 1, wherein all of the LEDs have a common wavelength converter and a common UV filter, wherein the common UV filter is disposed downstream of the LEDs in the emission direction and covers the LEDs completely, and wherein the wavelength converter is arranged between the common UV filter and the common visible filter, wherein the common visible filter covers the wavelength converter completely.

16. The optoelectronic module as claimed in claim 1, wherein the wavelength converter converts the UV radiation into green light having a peak wavelength in the range of 490 nm to 545 nm and the common visible filter is only transmissive for green light in the wavelength range between 490 nm and 545 nm.

17. The optoelectronic module as claimed in claim 1, wherein the at least one UV filter is fixed to at least one radiation-emitting side of the light emitting diode chip.

* * * * *

UNITED STATES PATENT AND TRADEMARK OFFICE
CERTIFICATE OF CORRECTION

PATENT NO. : 8,585,246 B2
APPLICATION NO. : 12/863717
DATED : November 19, 2013
INVENTOR(S) : Petersen et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 468 days.

Signed and Sealed this
Twenty-second Day of September, 2015

Michelle K. Lee
*Director of the United States Patent and Trademark Office*